(12) United States Patent
Chern

(10) Patent No.: US 10,854,758 B2
(45) Date of Patent: Dec. 1, 2020

(54) NON-VOLATILE MEMORY AND MANUFACTURING METHOD FOR THE SAME

(71) Applicant: NEXCHIP SEMICONDUCTOR CO., LTD., Anhui (CN)

(72) Inventor: Geeng-Chuan Chern, Anhui (CN)

(73) Assignee: NEXCHIP SEMICONDUCTOR CO., LTD., Anhui (CN)

( * ) Notice: Subject to any disclaimer, the term of this patent is extended or adjusted under 35 U.S.C. 154(b) by 0 days.

(21) Appl. No.: 16/278,427

(22) Filed: Feb. 18, 2019

(65) Prior Publication Data

US 2020/0152784 A1    May 14, 2020

(51) Int. Cl.
| | | |
|---|---|---|
| H01L 29/788 | (2006.01) | |
| H01L 29/78 | (2006.01) | |
| H01L 21/265 | (2006.01) | |
| H01L 21/762 | (2006.01) | |
| H01L 21/3213 | (2006.01) | |
| H01L 21/283 | (2006.01) | |
| H01L 29/423 | (2006.01) | |
| H01L 21/02 | (2006.01) | |
| H01L 27/11517 | (2017.01) | |
| H01L 29/66 | (2006.01) | |

(52) U.S. Cl.
CPC ...... *H01L 29/788* (2013.01); *H01L 21/02107* (2013.01); *H01L 21/02697* (2013.01); *H01L 21/265* (2013.01); *H01L 21/283* (2013.01); *H01L 21/32139* (2013.01); *H01L 21/76224* (2013.01); *H01L 27/11517* (2013.01); *H01L 29/42328* (2013.01); *H01L 29/66825* (2013.01); *H01L 29/7831* (2013.01)

(58) Field of Classification Search
CPC ......... H01L 21/02107; H01L 21/02697; H01L 21/283; H01L 21/32139; H01L 27/11517; H01L 29/42328; H01L 29/788
See application file for complete search history.

(56) References Cited

U.S. PATENT DOCUMENTS

| | | | |
|---|---|---|---|
| 10,269,818 B2 * | 4/2019 | Tsao | H01L 21/31056 |
| 2016/0013195 A1 * | 1/2016 | Tsao | H01L 29/66825 257/316 |
| 2016/0307911 A1 * | 10/2016 | Wu | H01L 29/40114 |
| 2017/0062446 A1 * | 3/2017 | Kodama | H01L 27/11524 |
| 2019/0355731 A1 * | 11/2019 | Shih | H01L 29/788 |

* cited by examiner

*Primary Examiner* — Matthew E Warren
(74) *Attorney, Agent, or Firm* — Global IP Services; Tianhua Gu

(57) ABSTRACT

The present invention provides a non-volatile memory and a manufacturing method for the same. In the non-volatile memory, a floating gate structure has a first sharp portion and a second sharp portion, and a corner formed by a side surface of the floating gate structure and a part of a top surface of the floating gate structure is not covered by a control gate structure. The corner is connected between the first sharp portion and one end of the second sharp portion. A tunneling dielectric layer of an erasing gate structure covers the first sharp portion, the second sharp portion, and a tip part of the corner.

7 Claims, 16 Drawing Sheets

NON-VOLATILE MEMORY AND MANUFACTURING METHOD FOR THE SAME

BACKGROUND OF THE PRESENT INVENTION

Field of Invention

The present invention belongs to the technical field of semiconductor, and in particular, to a non-volatile memory and a manufacturing method for the same.

Description of Related Arts

A non-volatile memory (NVM) refers to a computer memory in which the stored data will not disappear when power supply is turned off. Non-volatile memories can be classified into two major categories: read-only memories (ROMs) and flash memories, depending on whether data stored in a memory can be rewritten at any time while a computer is used. For the read-only memory: data cannot be changed or deleted once being stored, and content will not disappear after a power supply is turned off. Therefore, the read-only memory is usually used for storing programs or data that does not need to be changed in an electronic system or a computer system. The flash memory is an electrically erasable programmable read-only memory which allows erase or write for multiple times during operations. This technology is mainly used for general data storage and for data exchange and transmission between a computer and other digital products, such as a memory card and a USB flash disk.

Non-volatile memory cell of a single-transistor stack gate structure always has problem in the case of excessive erase. For example, when an excessive erase operation has already occurred in an unselected cell, the cell will generate a leakage current during a read operation. In order to solve this problem, it is necessary to provide a complex circuit layout that can verify functions such as erasing and reading. This arouses another problem, that is, the complex circuit layout will lead to a large memory cell size, which does not meet a miniaturization requirement of products. In another aspect, the problem of the leakage current can be solved by introducing an extra optional transistor, that is, the memory cell employs a double-transistor structure. However, the memory cell with the double-transistor structure is obviously larger in size than the memory cell with the single-transistor structure, and the issue of the size of the memory cell is not solved yet.

The technical solution disclosed in the U.S. Pat. No. 7,868,375B2 has provided a split-gate memory structure for solving the problem of excessive erase. Moreover, a double-transistor structure is employed, while the size of a memory cell is smaller than that of a general double-transistor memory cell. However, the technical solution of the U.S. Pat. No. 7,868,375B2 still has a problem. The tunneling effect between the floating gate and the erasing gate is restricted. In order to realize quick erase with a low power, a tunneling dielectric layer between the floating gate and the erasing gate is usually thin. However, the material of the existing tunneling dielectric layer is generally silicon oxide or silicon nitride. A thin tunneling dielectric layer easily causes current leakage, and electric charge stored in the floating gate will leak to the erasing gate and be erased, thereby causing poor data retention.

Therefore, it has been urgent to obtain smaller memory cell with small size, improve erase efficiency, and reduce erase voltage or improve data retention.

SUMMARY OF THE PRESENT INVENTION

In view of the foregoing disadvantages in the prior art, an object of the present invention is to provide a split-gate non-volatile memory and a manufacturing method for the same, to resolve the problems of low erase efficiency and poor data retention of memories in the prior art.

In order to accomplish the above and other related objects, the present invention provides a non-volatile memory, comprising: a substrate; at least one shallow trench isolation structure, where a top surface of the shallow trench isolation structure is higher than a top surface of the substrate, and a lower portion of the shallow trench isolation structure is embedded in the substrate to define a plurality of active regions in the substrate; at least one floating gate structure, located on the substrate and comprising a first gate dielectric layer and a first conductive layer in sequence from bottom to top, where the first conductive layer has a first sharp portion and a second sharp portion, the first sharp portion and the second sharp portion are attached to two opposite sidewalls of the shallow trench isolation structure respectively, and tips of the first sharp portion and the second sharp portion are higher than the top surface of the shallow trench isolation structure; at least one control gate structure, located on the floating gate structure, covering a partial area of the floating gate structure, and comprising a second gate dielectric layer and a second conductive layer in sequence from bottom to top, where a corner formed by one side surface of the floating gate structure and a part of a top surface of the floating gate structure is not covered by the control gate structure, and the corner is connected between the first sharp portion and one end of the second sharp portion; at least one erasing gate structure located on the substrate, where the erasing gate structure is located on a side, which is provided with the corner, of the floating gate structure and comprises a tunneling dielectric layer and an erasing gate conductive layer in sequence from bottom to top, the tunneling dielectric layer covers the first sharp portion, the second sharp portion and a tip part of the corner; and at least one word line structure, located on the substrate, where the word line structure is located on a side, which is away from the corner, of the floating gate structure and comprises a third gate dielectric layer and a word line conductive layer in sequence from bottom to top.

Optionally, the first sharp portion has a height ranging from 20 nm to 100 nm, and the second sharp portion has a height ranging from 20 nm to 100 nm.

Optionally, a part of the tunneling dielectric layer which is located above the source region has a thickness greater than that of the first gate dielectric layer.

Optionally, the non-volatile memory further has a protection dielectric layer formed on the control gate structure, and the tunneling dielectric layer further covers a part of the protection dielectric layer.

Optionally, the non-volatile memory further has at least one sidewall structure, the sidewall structure is disposed between the control gate structure and the erasing gate structure, between the floating gate structure and the word line structure, between the control gate structure and the word line structure, and on a side of the word line structure which is away from the floating gate structure.

Optionally, the non-volatile memory further comprises at least one source region and at least one drain region, the source region and the drain region are located in the substrate, the source region is located under the erasing gate structure and partially overlaps the floating gate structure, and the drain region is located on a side of the word line structure which is away from the floating gate structure, and partially overlaps the word line structure.

Optionally, the non-volatile memory further comprises a silicide layer, an interlayer dielectric layer, at least one metal bit line, and at least one contact plug; the silicide layer is located on the surface of the drain region, the surface of the word line conductive layer, and the surface of the erasing gate conductive layer; the interlayer dielectric layer is located on the substrate and covers structures on the substrate; the metal bit line is located on the interlayer dielectric layer; the contact plug is located in the interlayer dielectric layer, a top end of the contact plug is connected to the metal bit line, and a bottom end of the contact plug is connected to the drain region.

Optionally, the substrate is a P-type substrate, and the first conductive layer, the second conductive layer, the erasing gate conductive layer and the word line conductive layer are N-type doped; or the substrate is an N-type pad, and the first conductive layer, the second conductive layer, the erasing gate conductive layer and the word line conductive layer are P-type doped.

Optionally, the first gate dielectric layer has a thickness ranging from 5 nm to 15 nm, the second gate dielectric layer has a thickness ranging from 10 nm to 22 nm, the tunneling dielectric layer has a thickness ranging from 8 nm to 15 nm, and the third gate dielectric layer has a thickness ranging from 2 nm to 8 nm.

Optionally, materials of the first conductive layer, the second conductive layer, the erasing gate conductive layer and the word line conductive layer all comprise doped polysilicon.

The present invention further provides a manufacturing method for a non-volatile memory, comprising the following steps: providing a substrate, and forming a sacrificial layer on the substrate; forming at least one shallow trench isolation structure in the sacrificial layer and the substrate, where a lower portion of the shallow trench isolation structure defines a plurality of active regions in the substrate; removing the sacrificial layer to obtain a plurality of grooves located on the substrate and defined by an upper portion of the shallow trench isolation structure; forming a first gate dielectric layer and a first conductive layer in sequence from bottom to top in the grooves, and planarizing the first conductive layer until the first conductive layer is leveled with a top surface of the shallow trench isolation structure; performing anisotropic etching to the first conductive layer to form a first sharp portion and a second sharp portion, where the first sharp portion and the second sharp portion are attached to two opposite sidewalls of the shallow trench isolation structure respectively; removing a part of the shallow trench isolation structure so that tips of the first sharp portion and the second sharp portion are higher than the top surface of the shallow trench isolation structure; forming at least one control gate structure on the first conductive layer, where the control gate structure comprises a second gate dielectric layer and a second conductive layer in sequence from bottom to top; removing a part of the first conductive layer, where the remaining first conductive layer and the first gate dielectric layer under the remaining first conductive layer form a floating gate structure, the control gate structure covers a partial area of the floating gate structure, a corner formed by one side surface of the floating gate structure and a part of a top surface of the floating gate structure is not covered by the control gate structure, and the corner is connected between the first sharp portion and one end of the second sharp portion; forming at least one erasing gate structure on the substrate, where the erasing gate structure is located on a side, which is provided with the corner, of the floating gate structure and comprises a tunneling dielectric layer and an erasing gate conductive layer in sequence from bottom to top, the tunneling dielectric layer covering the first sharp portion, the second sharp portion and a tip part of the corner; and forming at least one word line structure on the substrate, where the word line structure is located on a side, which is away from the corner, of the floating gate structure and comprises a third gate dielectric layer and a word line conductive layer in sequence from bottom to top.

Optionally, the sacrificial layer at least comprises a pad oxide layer and a nitride layer located on the pad oxide layer.

Optionally, forming of the control gate structure comprises the following steps: forming the second gate dielectric layer, the second conductive layer and a protection dielectric layer in sequence from bottom to top; forming a patterned photoresist layer on the protection dielectric layer to define a control gate region; and performing anisotropic etching downward by using the patterned photoresist layer as a mask, until the first conductive layer is exposed, thereby obtaining the control gate structure.

Optionally, removal of a part of the first conductive layer to form the floating gate structure comprises the following steps: forming a patterned photoresist layer to cover the first conductive layer above a source region; removing a part of the first conductive layer which is not covered by the patterned photoresist layer and the control gate structure; removing the patterned photoresist layer; forming at least one first sidewall structure on each side of the first conductive layer, each side of the control gate structure, and each side of the protection dielectric layer; forming at least one second sidewall structure on an external side of the first sidewall structure, and removing a part of the first gate dielectric layer which is not covered by the first conductive layer, the first sidewall structure and the second sidewall structure; removing a part of the first conductive layer which is not covered by the control gate structure, the first sidewall structure and the second sidewall structure; injecting ions to the source region; and removing at least a part of the second sidewall structure to expose the tip of the corner, the tip of the first sharp portion, and the tip of the second sharp portion, and removing a part of the first gate dielectric layer which is not covered by the first conductive layer.

Optionally, forming the erasing gate structure and the word line structure comprises the following steps: depositing the tunneling dielectric layer, where the tunneling dielectric layer covers the surface of the substrate and structures on the substrate; removing a part of the tunneling dielectric layer, and reserving a part of the tunneling dielectric layer which is located above the source region; forming a third gate dielectric layer on the surface of the substrate; forming a third conductive layer on the surfaces of the third gate dielectric layer and the tunneling dielectric layer; and removing a part of the third conductive layer, reserving a part of the third conductive layer which is located above the source region as an erasing gate conductive layer, and reserving a part of the third conductive layer which is located on a side of the floating gate structure away from the corner as a word line conductive layer.

Optionally, a part of the tunneling dielectric layer is further reserved as a third sidewall structure, the third sidewall structure and the erasing gate structure are located on the two opposite sides of the floating gate structure, and the third sidewall structure covers an external side surface of the first sidewall structure.

Optionally, the manufacturing method for a non-volatile memory further comprises a step of forming at least one fourth sidewall structure on a side of the word line conductive layer which is away from the floating gate structure.

Optionally, the manufacturing method for a non-volatile memory further comprises: forming at least one drain region in the substrate, where the drain region is located on a side of the word line structure which is away from the floating gate structure, and partially overlaps the word line structure; forming a silicide layer on the surface of the drain region, the surface of the word line conductive layer, and the surface of the erasing gate conductive layer; forming an interlayer dielectric layer on the substrate to cover structures on the substrate; forming at least one metal bit line on the interlayer dielectric layer; and forming at least one contact plug in the interlayer dielectric layer, where a top end of the contact plug is connected to the metal bit line, and a bottom end of the contact plug is connected to the drain region.

As described above, in the non-volatile memory according to the present invention, a floating gate structure has a first sharp portion and a second sharp portion, and a corner formed by a side surface of the floating gate structure and a part of a top surface of the floating gate structure is not covered by a control gate structure. The corner is connected between the first sharp portion and one end of the second sharp portion. A tunneling dielectric layer of the erasing gate structure covers the first sharp portion, the second sharp portion, and a tip part of the corner. During an erase operation, electrons are injected into the erasing gate structure from the first sharp portion, the second sharp portion and the tip of the corner of the floating gate structure in an FN tunneling manner, thereby effectively enhancing an FN tunneling effect between the floating gate and the erasing gate, and improving erase efficiency. The sharp portions of the floating gate as well as the corner not covered by the control gate structure helps increase the thickness of the tunneling dielectric layer between the erasing gate and the floating gate, thereby preventing a leakage current and helping improve data retention. In the manufacturing method for a non-volatile memory according to the present invention, the floating gate structure having the first sharp portion and the second sharp portion is formed skillfully, and the process is simple and practical.

DESCRIPTIONS OF REFERENCE NUMERALS

Figure 1:
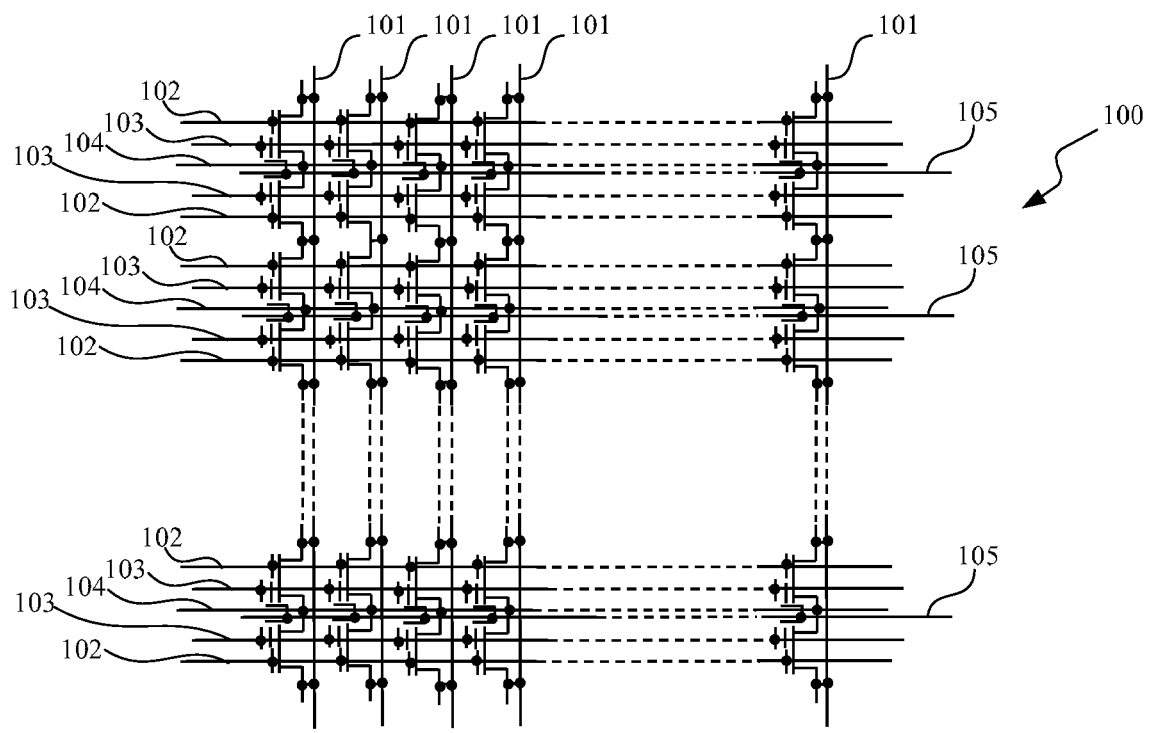
FIG. 1 is an array circuit diagram of a non-volatile memory according to the present invention.

100 Memory array
101 Bit line
102 Word line
103 Control gate line
104 Source line
105 Erasing gate line
106 Floating gate
107 Active region
108 Contact
201 Substrate
202 Pad oxide side
203 Nitride layer
204 Patterned photoresist layer
205 Shallow trench
206 Shallow trench isolation structure
207 First gate dielectric layer
208 First conductive layer
208a First sharp portion
208b Second sharp portion
208c Corner
209 Second gate dielectric layer
210 Second conductive layer
211 Protection dielectric layer
212 Patterned photoresist layer
213 Patterned photoresist layer
214 Sidewall material layer
214a First sidewall structure
215 Second sidewall structure
216 Patterned photoresist layer
217 Heavily doped source region
218 Tunneling dielectric layer
218a Third sidewall structure
219 Patterned photoresist layer
220 Third gate dielectric layer
221 Third conductive layer
221a Erasing gate conductive layer
221b Word line conductive layer
222 Patterned photoresist layer
223 Fourth sidewall structure
224 Lightly doped drain region
225 Heavily doped drain region
226 Silicide layer
227 Interlayer dielectric layer
228 Contact plug
229 Metal bit line

DETAILED DESCRIPTION OF THE PREFERRED EMBODIMENTS

Implementations of the present invention are illustrated below through specific embodiments. Persons skilled in the art can easily understand other advantages and efficacy of the present invention according to the content disclosed in this specification. The present invention can also be implemented or applied through other different specific implementations. Various modifications or variations can also be made on details in this specification based on different opinions and applications without departing from the spirit of the present invention.

Refer to FIGS. 1 to 43. It should be noted that, the figures provided in this embodiment merely illustrate the basic conception of the present invention schematically. Therefore, the figures only show components related to the present invention, and are not drawn according to the quantity, shapes and sizes of components during actual implementation. The pattern, quantity and ratio of components during actual implementation can be changed arbitrarily, and the component layout may also be more complex.

Referring to FIG. 1, FIG. 1 is an array circuit diagram of a non-volatile memory according to the present invention. A memory array 100 includes at least one bit line 101, at least one word line 102, at least one control gate line 103, at least one source line 104 and at least one erasing gate line 105. During an operation, a memory system applies an appropriate signal to the at least one bit line, the at least one word line, the at least one control gate line, the at least one source line, and the at least one erasing gate line to select a single memory cell. The memory system may read data from the memory cell, program the memory cell or erase the memory cell.

Figure 2:
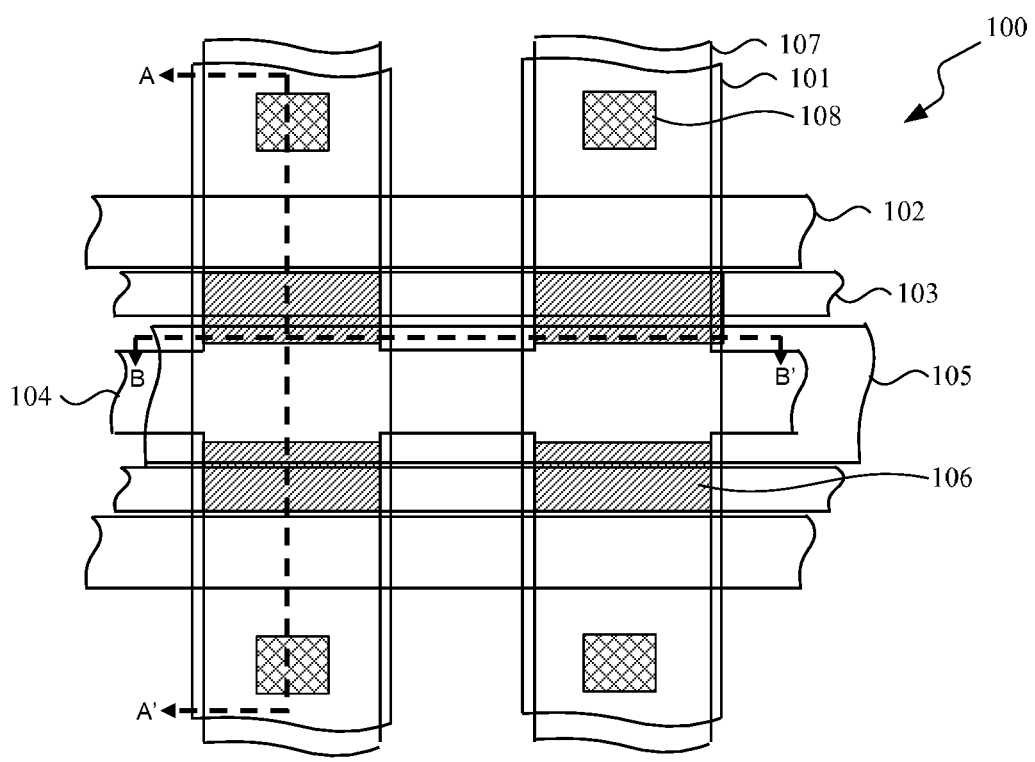
FIG. 2 is a top view of the array of a non-volatile memory according to the present invention.
Figure 39:
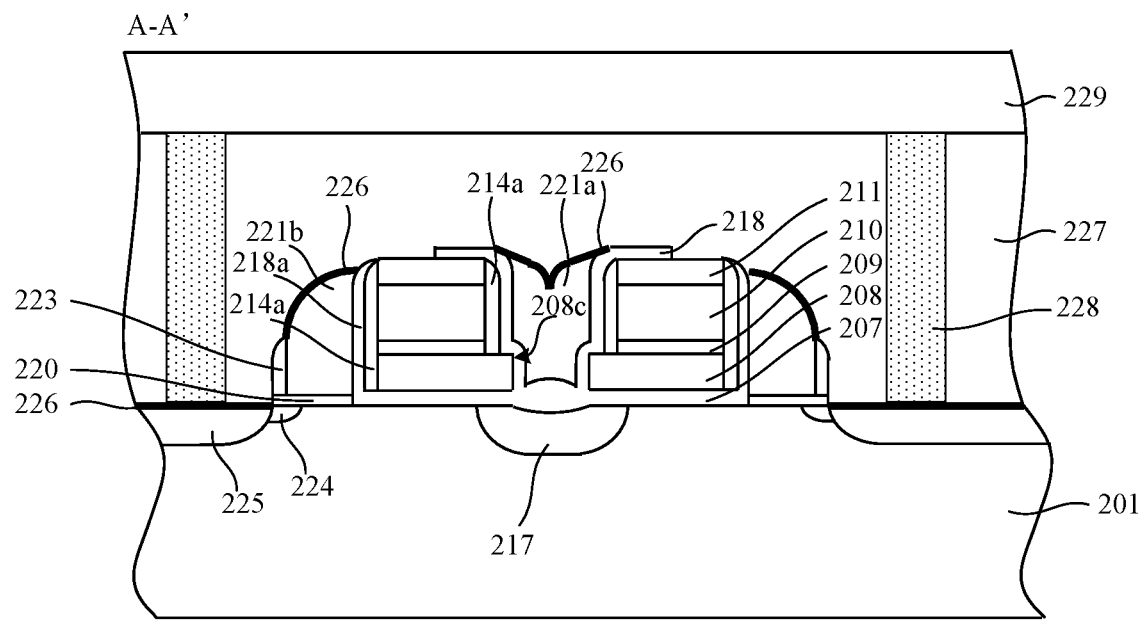
Figure 40:
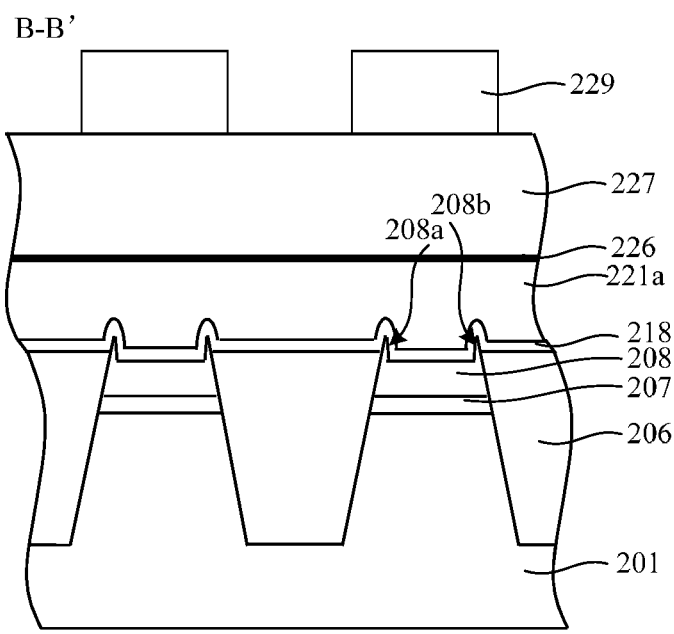

Referring to FIG. 2, FIG. 2 is a top view of the array of a non-volatile memory according to the present invention. The memory array 100 comprises at least one bit line 101, at least one word line 102, at least one control gate line 103, at least one source line 104, at least one erasing gate line 105, at least one floating gate 106, at least one active region 107 and at least one contact 108. Referring to FIG. 39 and FIG. 40, FIG. 39 and FIG. 40 are cross section diagram of FIG. 2 along direction A-A' and along direction B-B' respectively. The bit line 101 may be implemented by using the metal bit line 229. The word line 102 may be implemented by using the word line conductive layer 221b. The control gate line 103 may be implemented by using the second conductive layer 210. The source line 104 may be implemented by using an active layer, which also includes at least a transistor channel, at least a source region and at least a drain region. The erasing gate line 105 may be implemented by using the erasing gate conductive layer 221a. The floating gate 106 may be implemented by using the first conductive layer 208. The active region 107 may be defined in a substrate 201 by a shallow trench isolation structure 206. The contact 108 may be implemented by using contact plug 228.

Referring to FIGS. 3 to 40, FIG. 3 to FIG. 40 are cross section diagrams after each corresponding step in a manufacturing method for a non-volatile memory according to the present invention.

Figure 3:
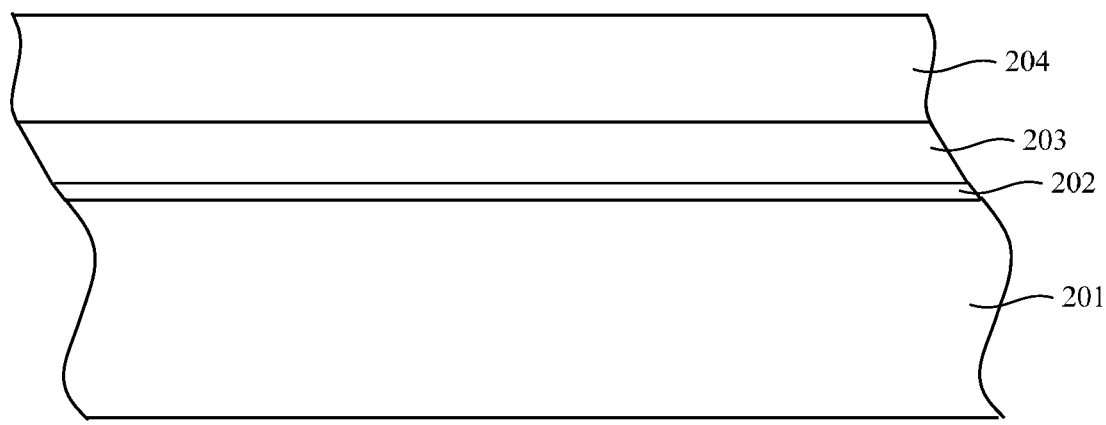
FIGS. 3 to 40 are cross section diagrams after each corresponding step in a manufacturing method for a non-volatile memory according to the present invention.
Figure 4:
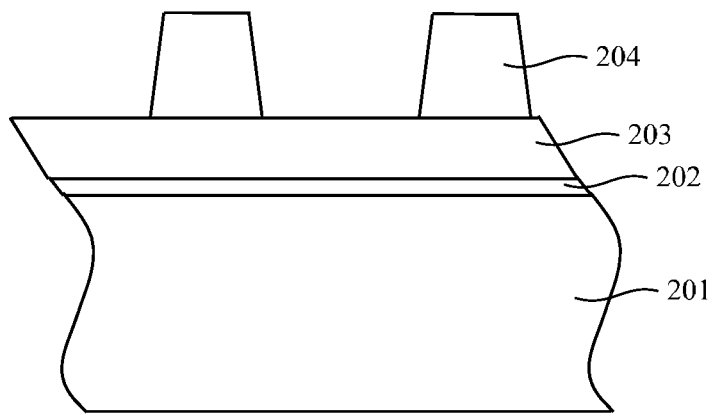

In FIG. 3 and FIG. 4, a substrate 201 is provided, a sacrificial layer is formed on the substrate 201, and a patterned photoresist layer 204 is formed on the sacrificial layer to define a shallow trench isolation (STI) region.

For example, the substrate 201 is a P-type doped semiconductor substrate, such as a P-type silicon substrate. The sacrificial layer at least comprises a pad oxide layer 202 (pad oxide) and a nitride layer 203 located on the pad oxide layer. The pad oxide layer 202 may be a silicon dioxide layer for protecting the surface of the substrate 201. The nitride layer 203 may be a silicon nitride layer used as a hard mask layer. The pad oxide layer 202 has a thickness ranging from 10 nm to 50 nm, and the nitride layer 203 has a thickness ranging from 80 to 200 nm.

It should be noted that, the substrate 201 may be an N-type doped semiconductor substrate. In this case, all the doped regions in the subsequent description need to be changed from N-type to P-type. In another embodiment, the purely P-type substrate may be replaced with a triple-well structure. For example, the P-type substrate comprises a deep N well, and a P well is formed in the N well.

Figure 5:
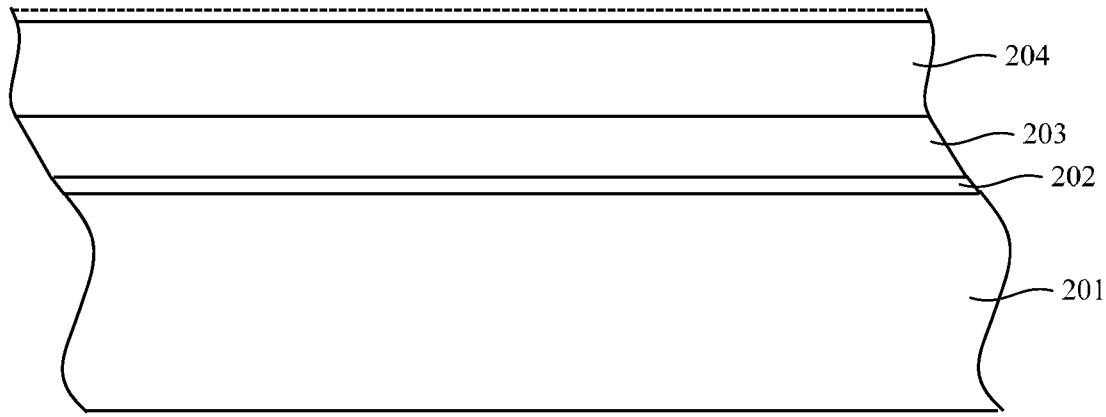
Figure 6:
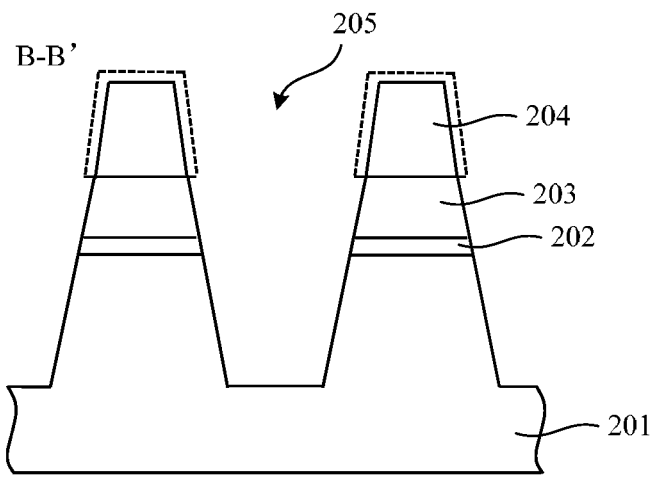

In FIG. 5 and FIG. 6, anisotropic etching is performed downward by using the patterned photoresist layer 204 as a mask, to form at least one shallow trench 205. For example, the direction of the anisotropic etching is perpendicular to the surface of the sacrificial layer, and the shallow trench 205 penetrates the sacrificial layer and extends into the substrate 201. A part of the patterned photoresist layer 204 is lost during the etching process. The surface of the original photoresist layer is indicated by dotted lines in FIG. 5 and FIG. 6. The loss of the photoresist layer causes the sacrificial layer to have inclined sidewalls.

Figure 7:
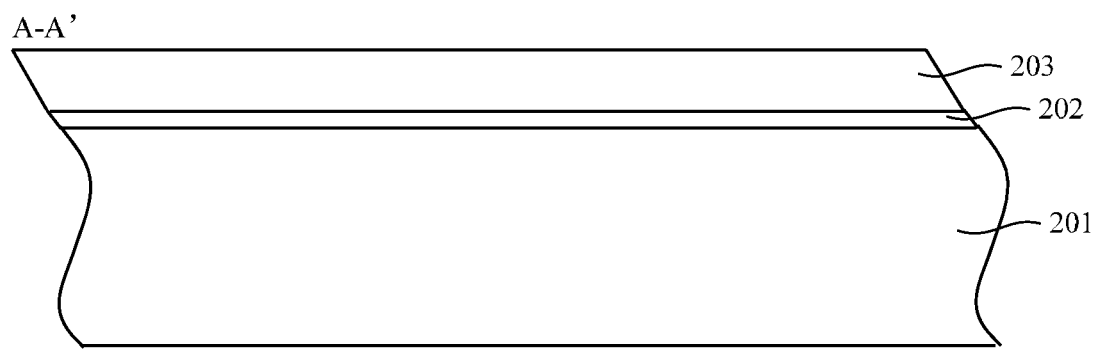
Figure 8:
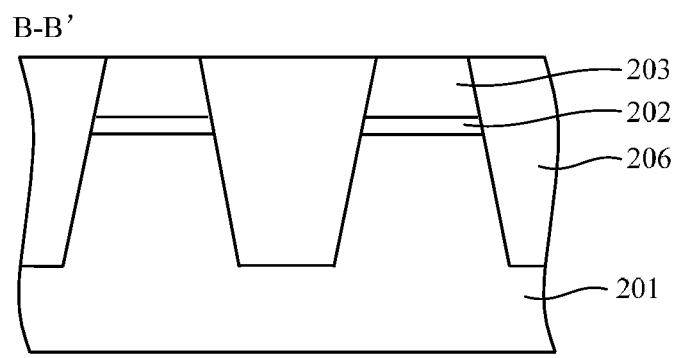

In FIG. 7 and FIG. 8, at least one shallow trench isolation structure 206 is formed in the sacrificial layer and the substrate 201. A lower portion of the shallow trench isolation structure 206 defines multiple active regions in the substrate 201.

Specifically, the patterned photoresist layer 204 is removed first. Then, a liner oxide layer having a thickness ranging from 5 nm to 20 nm is formed, and the shallow trench 205 is filled with an oxide layer, such as a high density plasma (HDP) oxide; next, planarization is performed through chemical mechanical polishing (CMP), until the oxide layer is leveled with the top surface of the sacrificial layer. The material in the shallow trench 205 forms the shallow trench isolation structure 206. Described above are steps of a standard STI manufacturing process.

Figure 9:
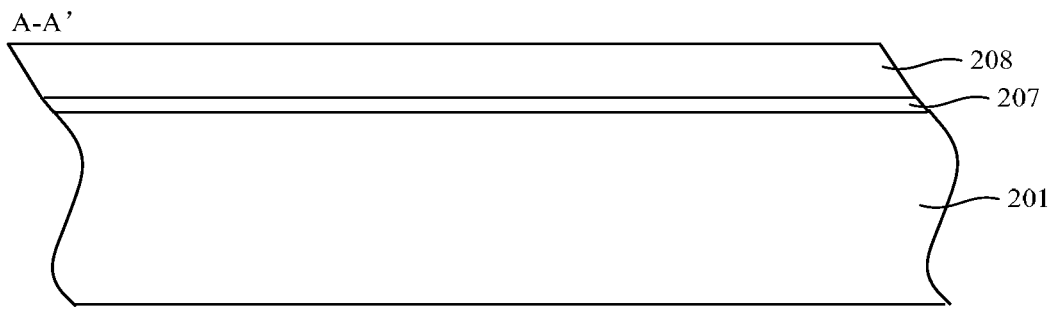
Figure 10:
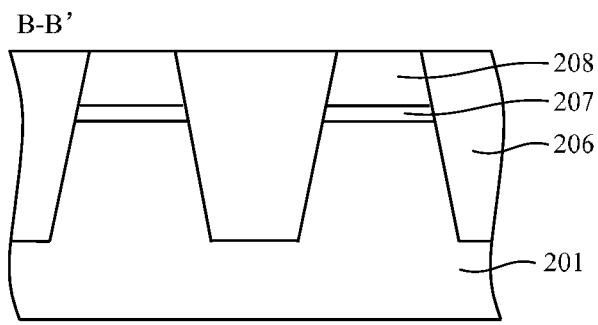

In FIG. 9 and FIG. 10, the sacrificial layer is removed to obtain a plurality of grooves that are located on the substrate 201 and defined by an upper portion of the shallow trench isolation structure 206. Then, a first gate dielectric layer 207 and a first conductive layer 208 are formed in sequence from bottom to top in the grooves, and the first conductive layer 208 is planarized until being leveled with the top surface of the shallow trench isolation structure 206.

Specifically, the nitride layer 203 in the sacrificial layer is preferably removed by means of wet chemical corrosion, for example, using a hot phosphoric acid. The first gate dielectric layer 207 has a thickness ranging from 5 nm to 15 nm, and the material thereof may be an oxide or an oxynitride. The material of the first conductive layer 208 may be N-type polysilicon.

Figure 11:
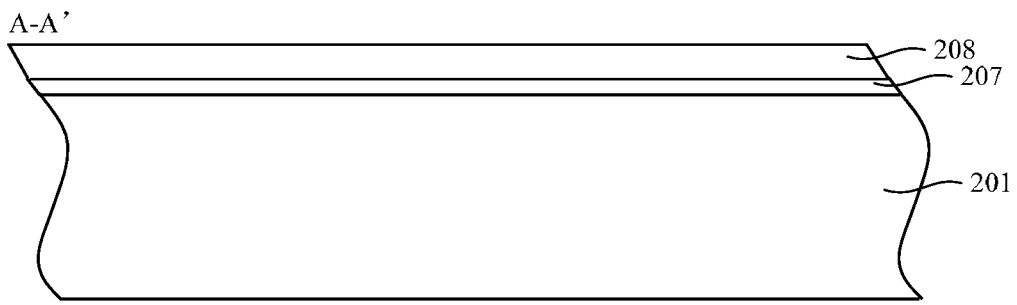
Figure 12:
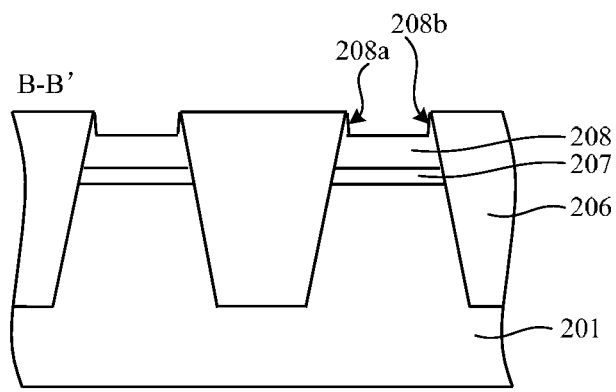

In FIG. 11 and FIG. 12, anisotropic etching is performed to the first conductive layer 208 to form a first sharp portion 208a and a second sharp portion 208b. The first sharp portion 208a and the second sharp portion 208b are attached to two opposite sidewalls of the shallow trench isolation structure 206 respectively.

For example, the direction of the anisotropic etching is perpendicular to the surface of the first conductive layer 208. A removed part of the first conductive layer 208 has a thickness ranging from 20 nm to 100 nm. Correspondingly, the first sharp portion 208a has a height ranging from 20 nm to 100 nm, and the second sharp portion 208b has a height ranging from 20 nm to 100 nm.

Figure 13:
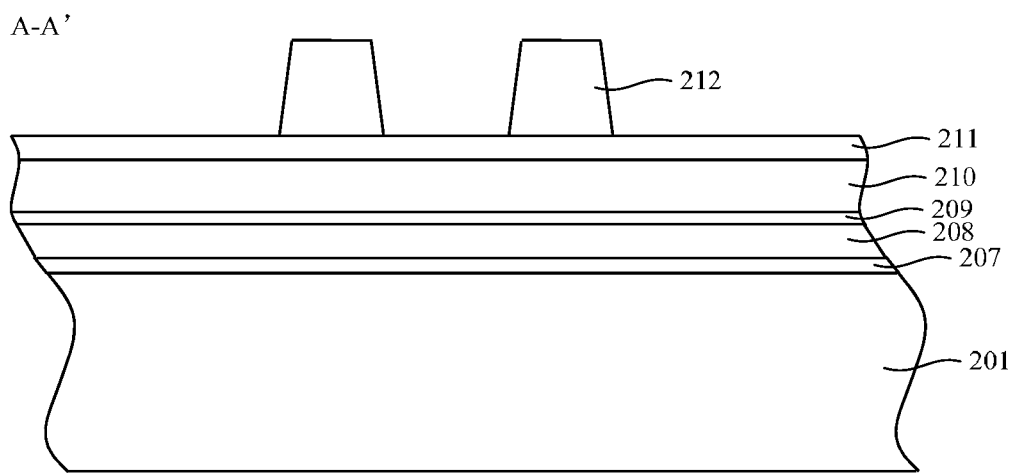
Figure 14:
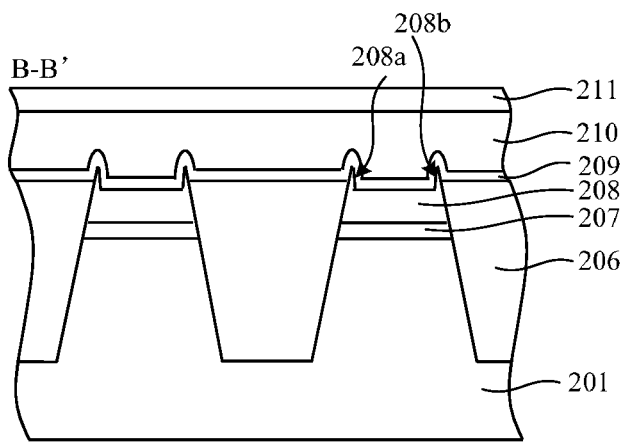

In FIG. 13 and FIG. 14, a part of the shallow trench isolation structure 206 is removed first, so that tips of the first sharp portion 208a and the second sharp portion 208b are higher than the top surface of the shallow trench isolation structure 206. Then, a second gate dielectric layer 209, a second conductive layer 210 and a protection dielectric layer 211 are deposited in sequence from bottom to top, and a patterned photoresist layer 212 is formed on the protection dielectric layer 211 to define a control gate region.

For example, a part of the STI oxide, with a thickness of 20 nm to 80 nm, is removed to expose the tips of the first sharp portion 208a and the second sharp portion 208b. The material of the second gate dielectric layer 209 may be an oxide or a nitride. The second gate dielectric layer 209 may employ a typical ONO structure formed by a first oxide layer with a thickness of 3 nm to 7 nm, a nitride layer with a thickness of 4 nm to 8 nm, and a second oxide layer with a thickness of 3 nm to 7 nm stacked together. The second conductive layer 210 has a thickness ranging from 80 nm to 300 nm, the material thereof may be, but is not limited to, N-type doped polysilicon. The protection dielectric layer 211 has a thickness ranging from 40 nm to 100 nm, and a material thereof may be an oxide, a nitride, or a mixture of an oxide and a nitride.

Figure 15:
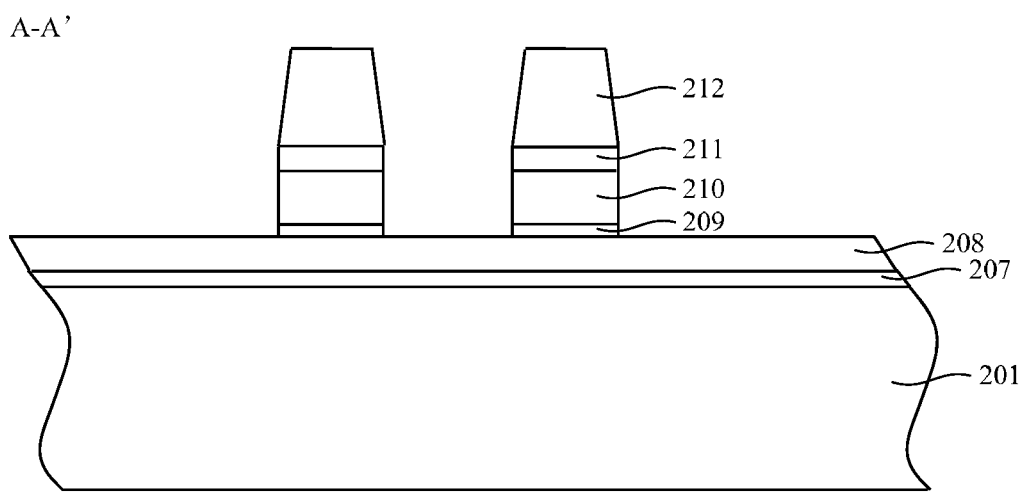
Figure 16:
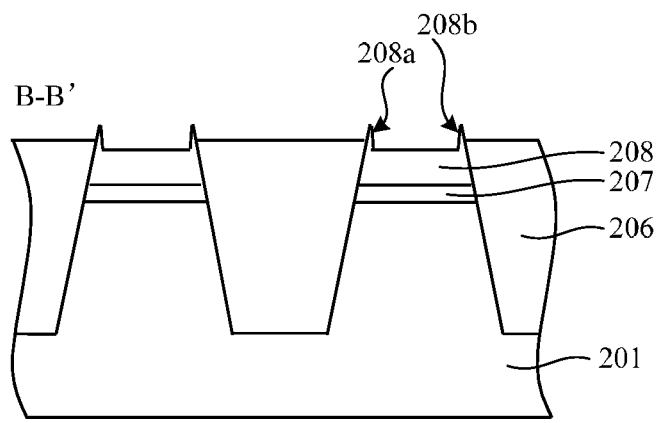

In FIG. 15 and FIG. 16, anisotropic etching is performed downward by using the patterned photoresist layer 212 as a mask, until the first conductive layer 208 is exposed, thereby obtaining a control gate structure on the first conductive layer 208. The control gate structure includes a second gate dielectric layer 209 and a second conductive layer 210, where the second conductive layer 210 is located on the second gate dielectric layer 209. The direction of the anisotropic etching is perpendicular to the surface of the first conductive layer 208.

Figure 17:
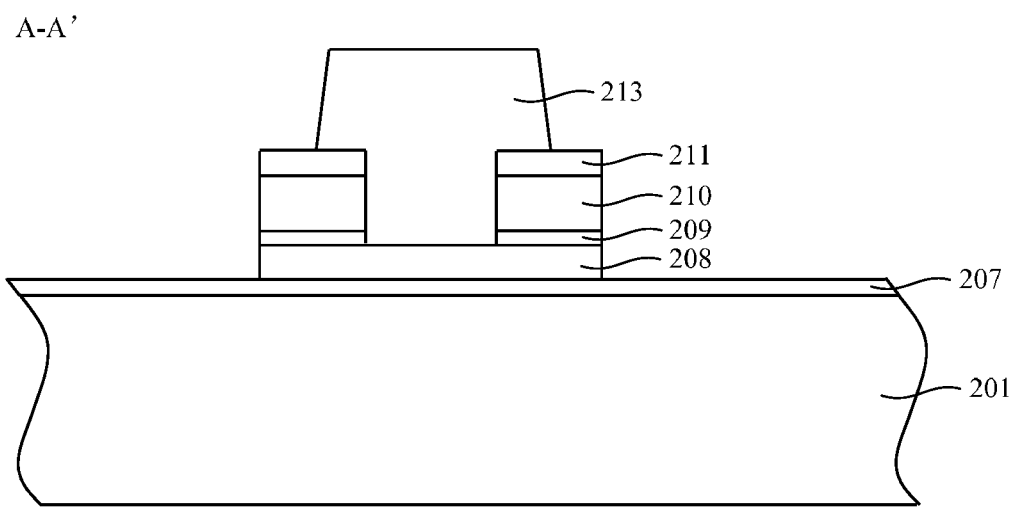
Figure 18:
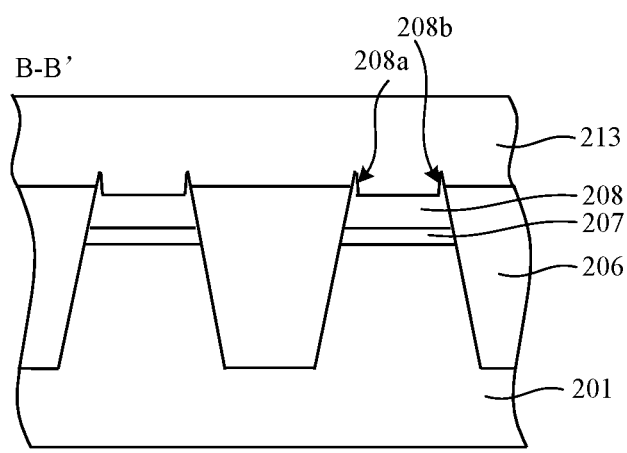

In FIG. 17 and FIG. 18, the patterned photoresist layer 212 is removed first, and another patterned photoresist layer 213 is formed to cover the first conductive layer 208 above a source region; then anisotropic etching is performed to remove a part of the first conductive layer 208 which is not covered by the patterned photoresist layer 213 and the control gate structure. In this embodiment, the direction of the anisotropic etching is perpendicular to the surface of the first conductive layer 208.

Figure 19:
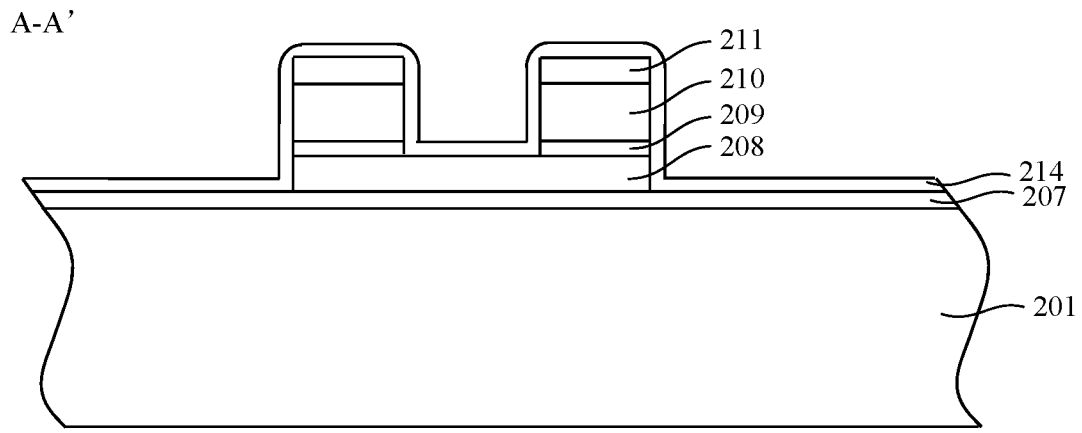
Figure 20:
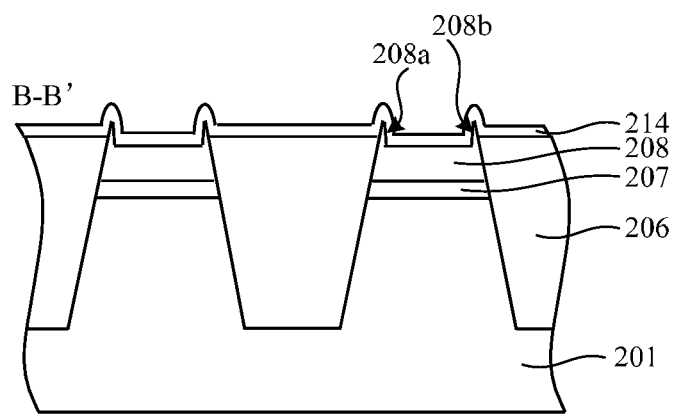

In FIG. 19 and FIG. 20, the patterned photoresist layer 213 is removed first, and a sidewall material layer 214 with a thickness of 10 nm to 30 nm is deposited over the entire structure.

Figure 21:
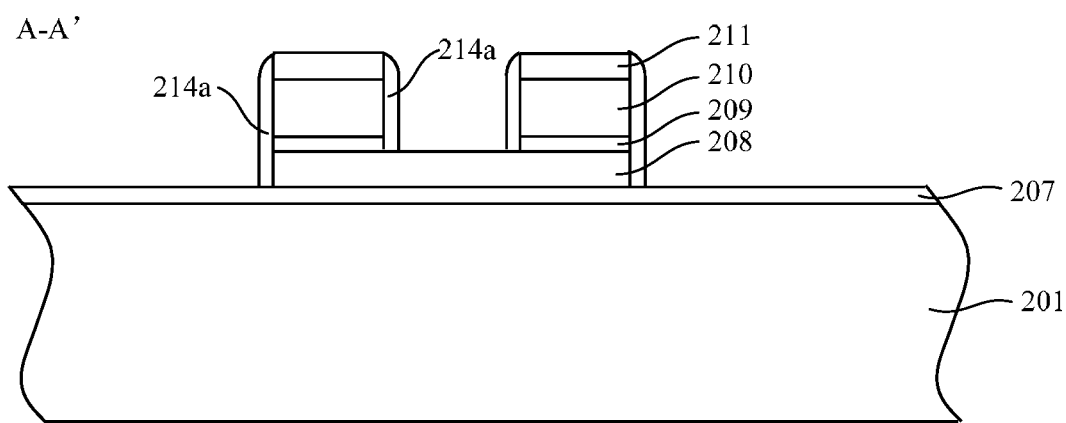
Figure 22:
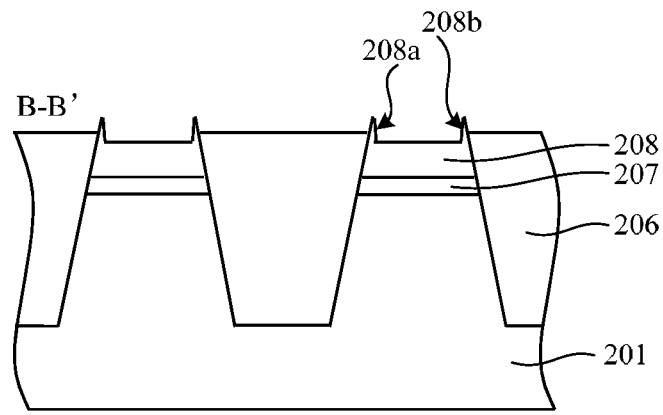

In FIG. 21 and FIG. 22, anisotropic etching is performed to the sidewall material layer 214 until the surface of the first conductive layer 208 is exposed, the remaining sidewall material layer 214 forms first sidewall structures 214a on each side of the first conductive layer 208, each side of the control gate structure, and each side of the protection dielectric layer 211. In this embodiment, the direction of the anisotropic etching is perpendicular to the surface of the first conductive layer 208.

Figure 23:
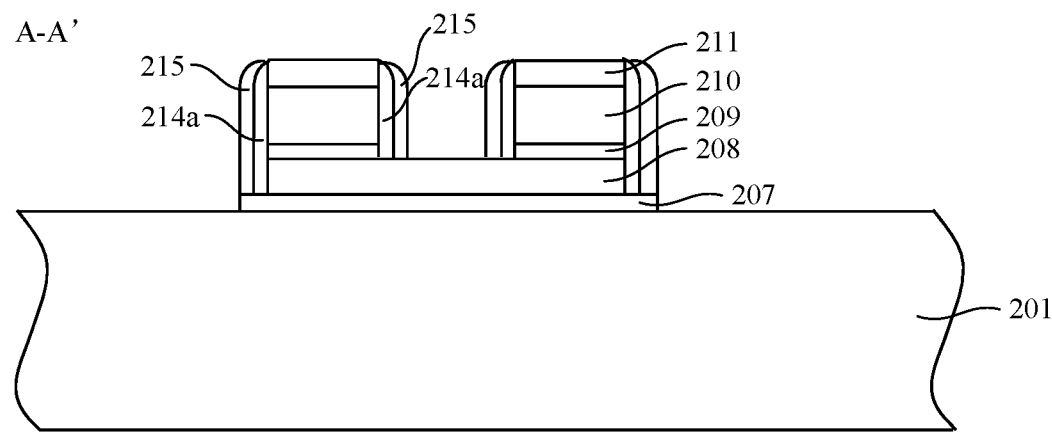
Figure 24:
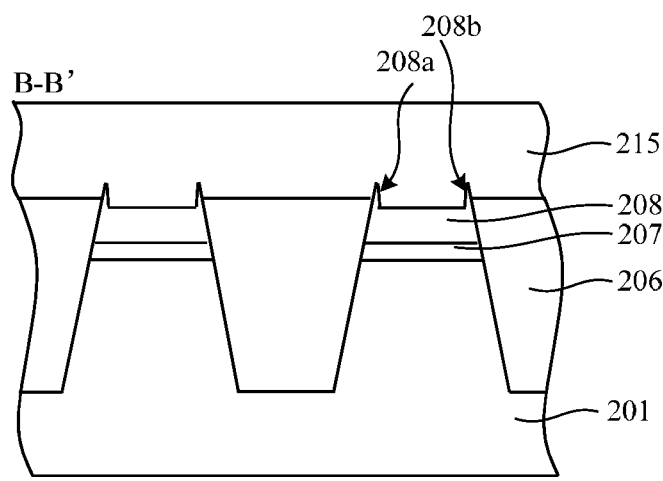

In FIG. 23 and FIG. 24, an oxide layer with a thickness of 10 nm to 30 nm is formed first; then anisotropic etching is performed to the oxide layer until the surface of the first conductive layer 208 is exposed, and the remaining oxide layer forms a second sidewall structure 215 on an external side of the first sidewall structure 214a; next, removing a part of the first gate dielectric layer 207 which is not covered by the first conductive layer 208, the first sidewall structure 214a and the second sidewall structure 215. In this embodiment, the direction of the anisotropic etching is perpendicular to the surface of the first conductive layer 208.

Figure 25:
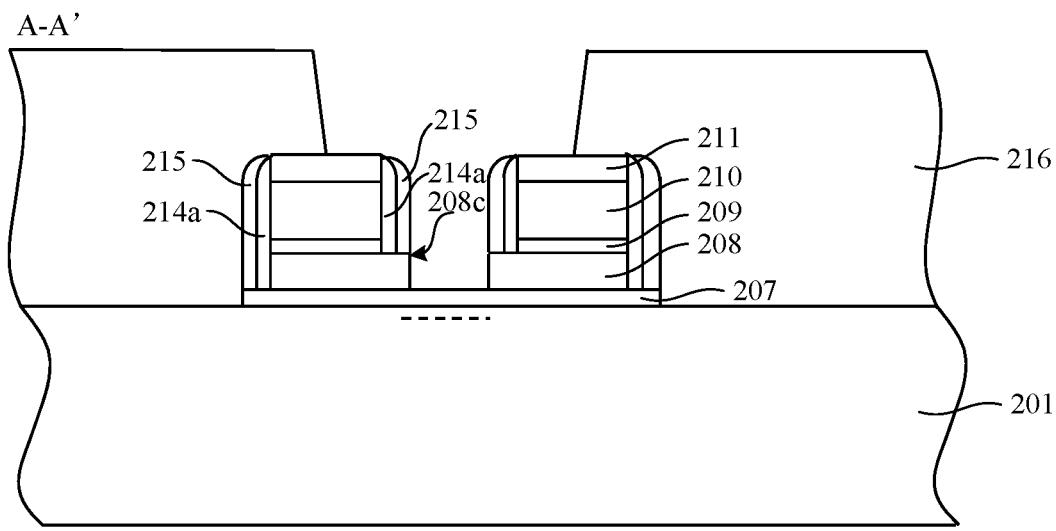
Figure 26:
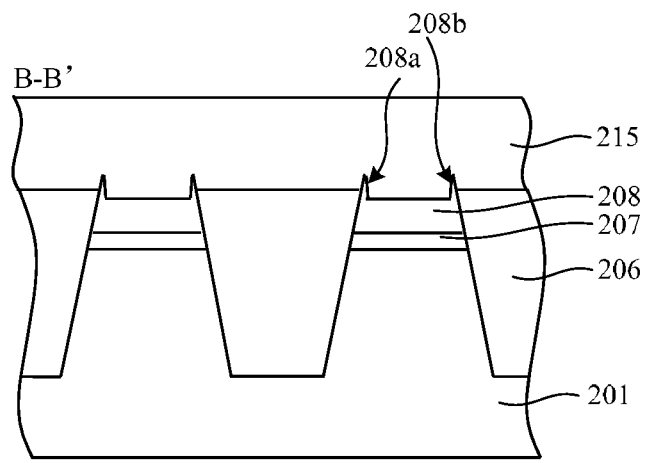

In FIG. 25 and FIG. 26, a patterned photoresist layer 216 is formed to expose the source region, and anisotropic etching is performed to remove a part of the first conductive layer 208 which is not covered by the control gate structure, the first sidewall structure 214a and the second sidewall structure 215, so as to define a floating gate region; then, N-type ions are injected into the source region. In this embodiment, the direction of the anisotropic etching is perpendicular to the surface of the first conductive layer 208. The remaining first conductive layer 208 and the first gate dielectric layer 207 under the remaining first conductive layer 208 form a floating gate structure. The control gate structure covers partial area of the floating gate structure. A corner 208c formed by one side surface of the floating gate structure and a part of a top surface of the floating gate structure is not covered by the control gate structure. The corner 208c is connected between the first sharp portion 208a and the second sharp portion 208b. In this embodiment, the injected N-type ions are preferably a combination of phosphorus and arsenic ions. Phosphorus ions have injection energy ranging from 50 KeV to 100 KeV and a dosage ranging from 1E13/cm$^2$ to 9E14/cm$^2$. Arsenic ions have injection energy ranging from 20 KeV to 80 KeV and a dosage ranging from 1E15/cm$^2$ to 8E15/cm$^2$. For example, an ion injection position is shown by a dotted line in FIG. 25.

Figure 27:
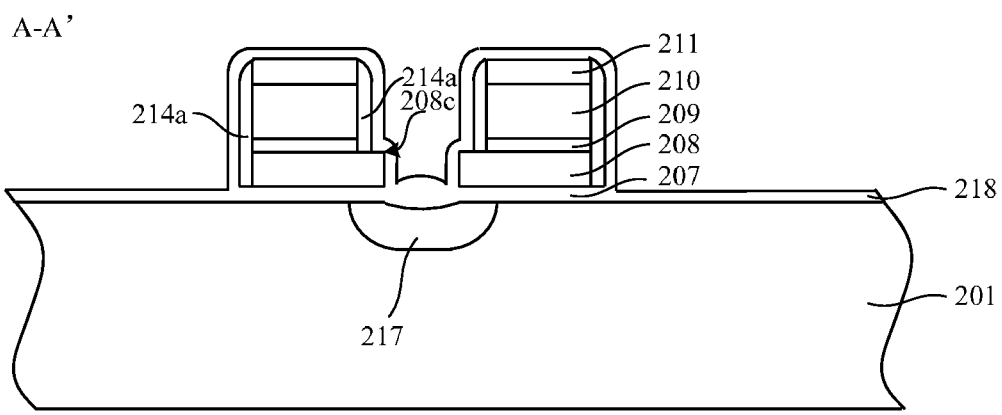
Figure 28:
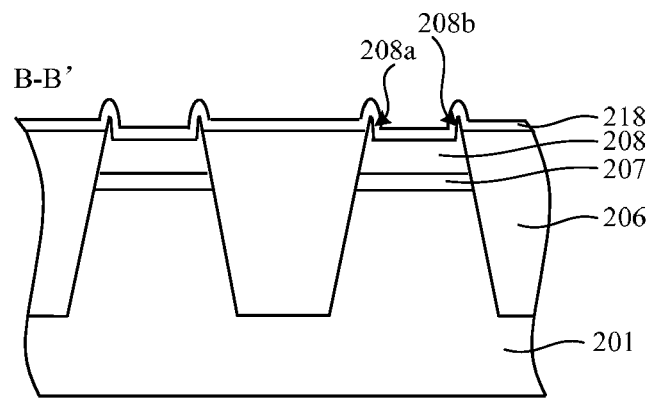

In FIG. 27 and FIG. 28, the patterned photoresist layer 216 is removed first, and then rapid thermal annealing (RTA) is performed to repair damage and drive in a doping agent to form a heavily doped source region 217. It should be noted that, the rapid thermal annealing here can be omitted if a heat cycle step in a subsequent process can achieve repairing damage and driving in a doping agent. Next, at least a part of the second sidewall structure 215 is removed by means of wet chemical corrosion to expose the tip of the corner 208c, the tip of the first sharp portion 208a and the tip of the second sharp portion 208b. For example, FIG. 27 and FIG. 28 show a case in which the second sidewall structure 215 is completely removed. Then, a part of the first gate dielectric layer 207 which is not covered by the first conductive layer 208 is removed, and a tunneling dielectric layer 218 is deposited. The tunneling dielectric layer 218 covers the surface of the substrate 201 and structures on the substrate 201.

Specifically, the tunneling dielectric layer 218 has a thickness ranging from 8 nm to 15 nm, and a material thereof may be an oxide, such as silicon dioxide. In this embodiment, the tunneling dielectric layer 218 is preferably made of a combination of a deposited oxide and a thermal oxide, for example, including both a high temperature oxide (HTO) and a thermal oxide, and is annealed by using NO or N$_2$O. During thermal oxidation circulation, due to high concentration of N-type doping ions, a part of the tunneling dielectric layer 218 located above the source region becomes thicker, and is thicker than the first gate dielectric layer 207.

Figure 29:
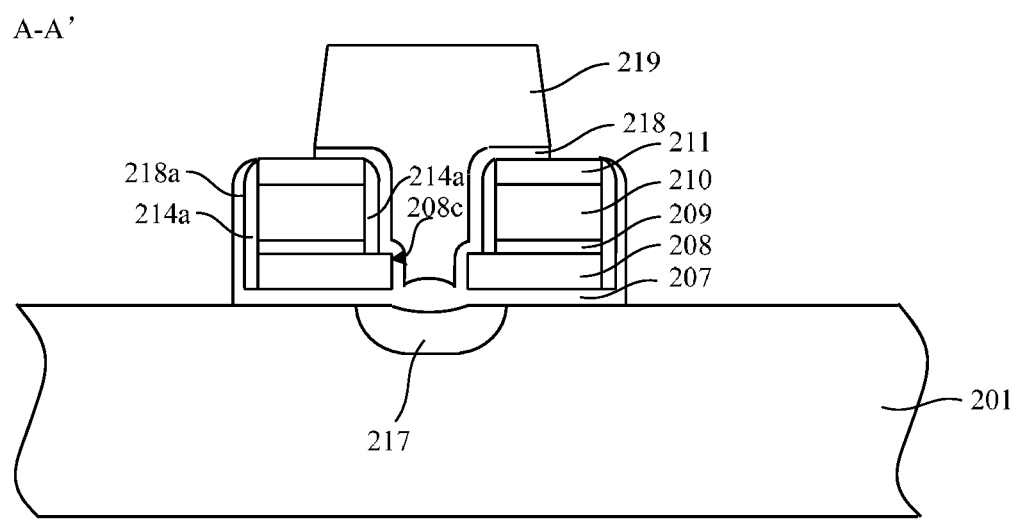
Figure 30:
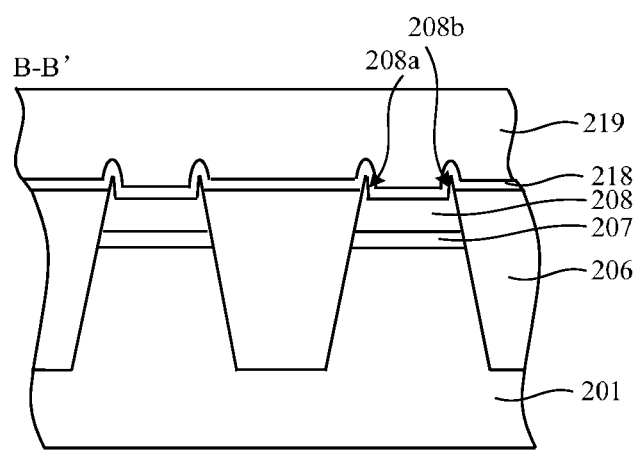

In FIG. 29 and FIG. 30, part of the tunneling dielectric layer 218 is removed, and the part of the tunneling dielectric layer 218 which is located above the source region is reserved.

Specifically, a patterned photoresist layer 219 is formed first to cover the source region, then etching is performed to remove the exposed tunneling dielectric layer 218. The etching method may be dry etching followed by wet etching, or may be wet etching only. If dry etching is followed by wet etching, in addition to the part above the source region, another part of the tunneling dielectric layer is also reserved as a third sidewall structure 218a. The third sidewall structure 218a is located on a side of the floating gate structure which is away from the source region, and covers an external side surface of the first sidewall structure 214a.

Figure 31:
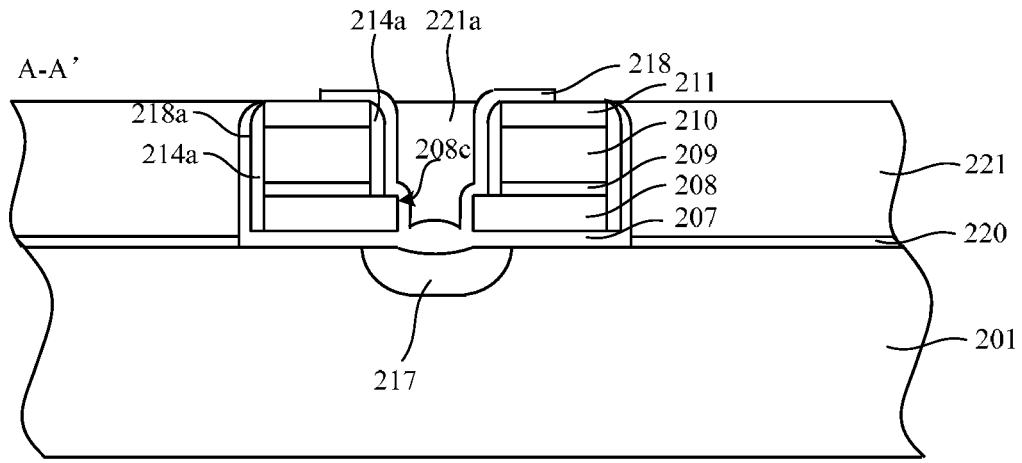
Figure 32:
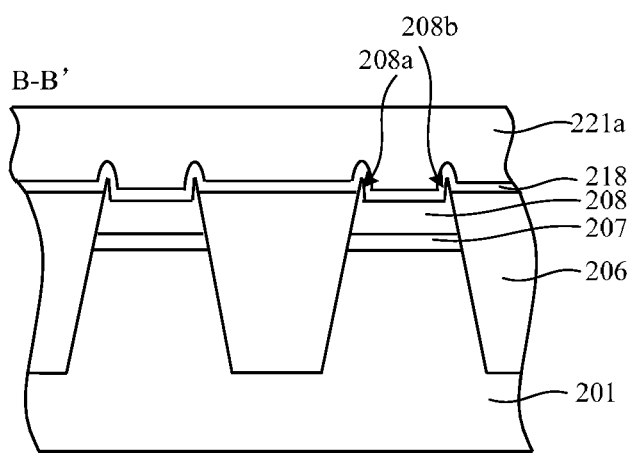

In FIG. 31 and FIG. 32, the patterned photoresist layer 219 is removed first; then a third gate dielectric layer 220 is formed on the surface of the substrate 201, and a third conductive layer 221 with a thickness greater than a step height is formed on the surfaces of the third gate dielectric layer 220 and the tunneling dielectric layer 218; next, a top surface of the third conductive layer 221 is planarized by means of, for example, chemical mechanical polishing. After the planarization, a part of the third conductive layer 221 which is located above the source region is used as an erasing gate conductive layer 221a. The tunneling dielectric layer 218 and the erasing gate conductive layer 221a above the tunneling dielectric layer 218 jointly form an erasing gate structure. The erasing gate structure is located on a side, which is provided with the corner 208c, of the floating gate structure. The tunneling dielectric layer 218 covers the first sharp portion 208a, the second sharp portion 208b, and the tip part of the corner 208c.

Specifically, the third gate dielectric layer 220 has a thickness ranging from 2 nm to 8 nm, and the material thereof may be an oxide such as silicon dioxide, or may be an oxynitride such as silicon oxynitride. The material of the third conductive layer 221 may be doped polysilicon.

Figure 33:
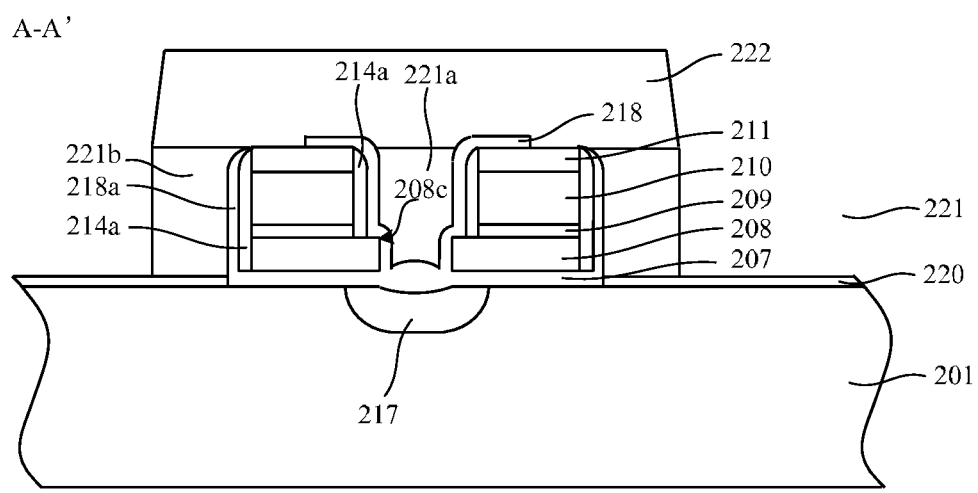
Figure 34:
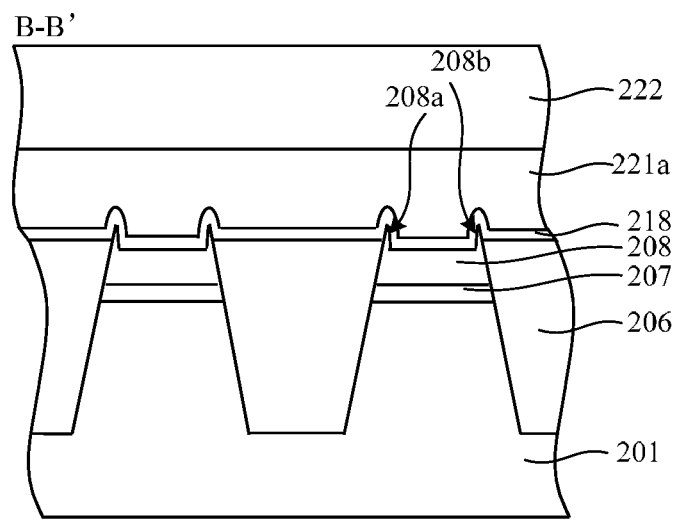
Figure 35:
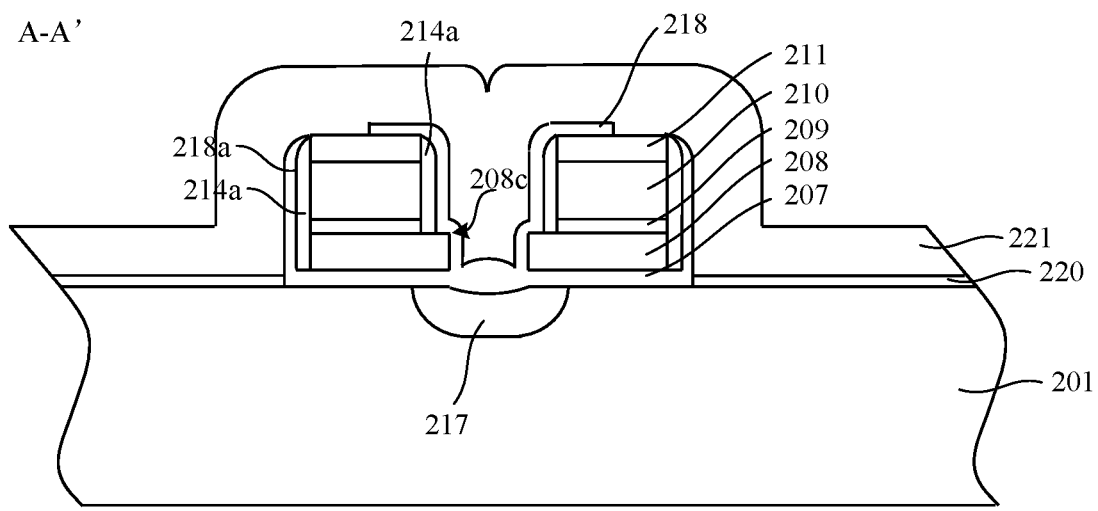
Figure 36:
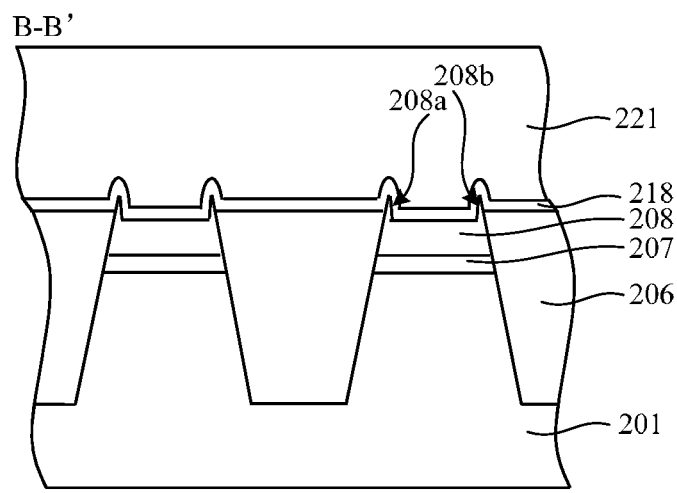

In FIG. 33 and FIG. 34, a patterned photoresist layer 222 is formed to define a word line region and cover the erasing gate region; then anisotropic etching is performed to the third conductive layer 221 by using the patterned photoresist layer 222 as a mask to remove the uncovered part of the third conductive layer 211; finally, a part of the third conductive layer 221 which is located above the source region is reserved as an erasing gate conductive layer 221a, and a part of the third conductive layer 221 which is located on a side of the floating gate structure away from the corner 208c is reserved as a word line conductive layer 221b. The word line conductive layer 221b and the third gate dielectric layer 220 under the word line conductive layer 221b jointly form a word line structure. Next, the patterned photoresist layer 222 (not shown in the figure) is removed.

Figure 37:
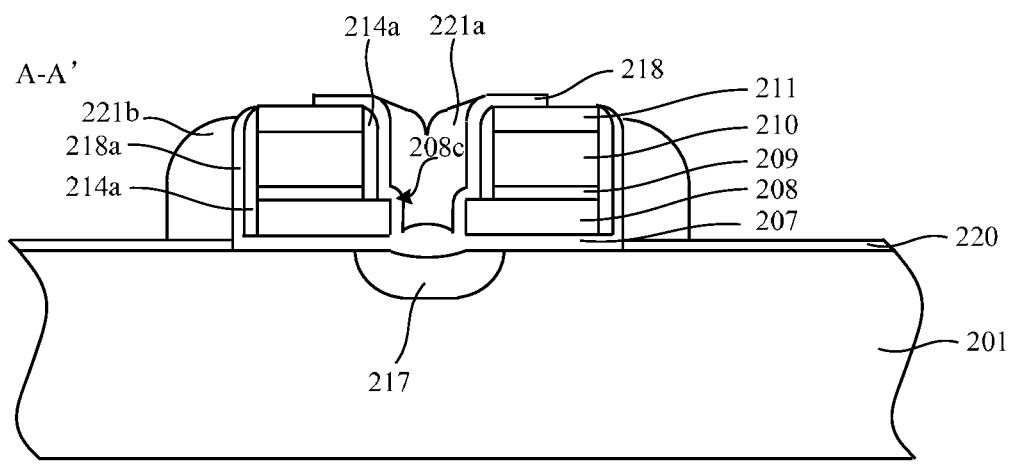
Figure 38:
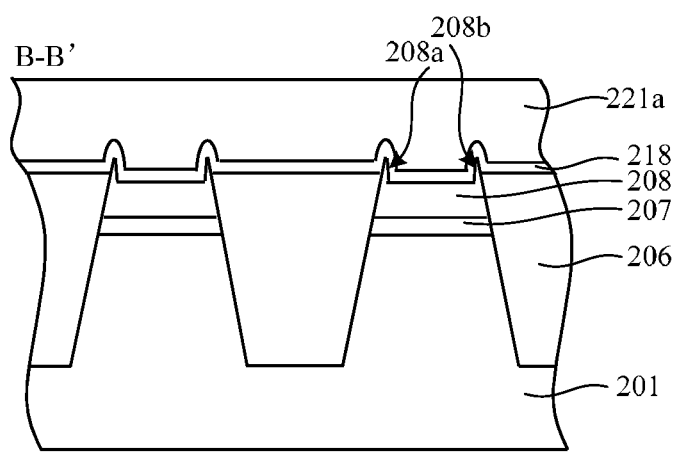

In a variant embodiment, the word line structure may be formed on the substrate 201 by using another solution. Referring to FIG. 29, FIG. 30, FIG. 35, and FIG. 36, the patterned photoresist layer 219 is removed first; then a third gate dielectric layer 220 with a thickness ranging from 2 nm to 8 nm is formed on the surface of the substrate 201; next, a third conductive layer 221 with a thickness ranging from 100 nm to 450 nm is deposited, where the third conductive layer 221 covers the surfaces of structures on the substrate 201 and forms a step. In FIG. 37 and FIG. 38, anisotropic etching is performed to the third conductive layer 221 to remove a part of the third conductive layer 221, until the gate dielectric layer 220 and the protection dielectric layer 211 are exposed, where the etching direction is preferably perpendicular to the surface of the substrate 201. Finally, a part of the third conductive layer 221 which is located above the source region is reserved as an erasing gate conductive layer 221a, and a part of the third conductive layer 221 which is on a side of the floating gate structure away from the corner 208c is reserved as a word line conductive layer 221b. The erasing gate conductive layer 221a and the tunneling dielectric layer 218 under the erasing gate conductive layer 221a jointly form an erasing gate structure; the word line conductive layer 221b and the third gate dielectric layer 220 under the word line conductive layer 221b jointly form a word line structure.

In FIG. 39 and FIG. 40, a back end process in standard integrated circuit manufacturing is continued to be performed to form at least one lightly doped drain region 224, at least one fourth sidewall structure 223, at least one heavily doped drain region 225, a silicide layer 226 (self-aligned silicide), an interlayer dielectric layer 227, at least one contact, at least one contact plug 228 and at least one metal bit line 229. The lightly doped drain region 224 and the heavily doped drain region 225 form a drain region. The drain region is formed in the substrate 201, located on a side of the word line structure which is away from the floating gate structure, and partially overlaps the word line structure.

Specifically, the at least one lightly doped drain region 224 is formed in the substrate 201 first. Then, the fourth sidewall structure 223 is formed, where the fourth sidewall structure 223 is located on a side of the word line conductive layer 221b which is away from the floating gate structure. Next, the silicide layer 226 is formed on the surface of the drain region, the surface of the word line conductive layer 221b and the surface of the erasing gate conductive layer 221a. The interlayer dielectric layer 227 is formed on the substrate 201 and covers structures on the substrate 201. The at least one metal bit line 229 is formed on the interlayer dielectric layer 227. The at least one contact plug 228 is formed in the interlayer dielectric layer 227. A top end of the contact plug 228 is connected to the metal bit line 229, and a bottom end of the contact plug 228 is connected to the drain region.

In view of the above, a non-volatile memory is manufactured. The non-volatile memory at least comprises a substrate 201, at least one shallow trench isolation structure 206, at least one floating gate structure, at least one control gate structure, at least one erasing gate structure and at least one word line structure. A top surface of the shallow trench isolation structure 206 is higher than a top surface of the substrate 201, and a lower portion of the shallow trench isolation structure 206 is embedded in the substrate 201 to define a plurality of active regions in the substrate 201. The floating gate structure is located on the substrate 201 and comprises a first gate dielectric layer 207 and a first conductive layer 208 in sequence from bottom to top. The first conductive layer 208 has a first sharp portion 208a and a second sharp portion 208b; the first sharp portion 208a and the second sharp portion 208b are attached to two opposite sidewalls of the shallow trench isolation structure 206 respectively, and tips of the first sharp portion 208a and the second sharp portion 208b are higher than the top surface of the shallow trench isolation structure 206. The control gate structure is located on the floating gate structure, covers a partial area of the floating gate structure, and comprises a second gate dielectric layer 209 and a second conductive layer 210 in sequence from bottom to top. A corner 208c formed by one side surface of the floating gate structure and a part of a top surface of the floating gate structure is not covered by the control gate structure, and the corner 208c is connected between the first sharp portion 208a and one end of the second sharp portion 208b. The erasing gate structure is located on the substrate 201 and on a side, which is provided with the corner 208c, of the floating gate structure, and comprises a tunneling dielectric layer 218 and an erasing gate conductive layer 221a in sequence from bottom to top. The tunneling dielectric layer 218 covers the first sharp portion 208a, the second sharp portion 208b and a tip part of the corner 208c. The word line structure is located on the substrate 201 and on a side, which is away from the corner 208c, of the floating gate structure, and comprises a third gate dielectric layer 220 and a word line conductive layer 221b in sequence from bottom to top. The first sharp portion 208a has a height ranging from 20 nm to 100 nm, and the second sharp portion 208b has a height ranging from 20 nm to 100 nm. A part of the tunneling dielectric layer 218 which is located above the source region has a thickness greater than that of the first gate dielectric layer 207. The non-volatile memory further has a protection dielectric layer 211 formed on the control gate structure, and the tunneling dielectric layer 218 further covers a part of the protection dielectric layer 211. The non-volatile memory further has at least one sidewall structure. The sidewall structure is disposed between the control gate structure and the erasing gate structure, between the floating gate structure and the word line structure, between the control gate structure and the word line structure, and on a side of the word line structure which is away from the floating gate structure. The non-volatile memory further comprises at least one source region and at least one drain region. The source region and the drain region are located in the substrate. The source region is located under the erasing gate structure and partially overlaps the floating gate structure. The drain region is located on a side of the word line structure which is away from the floating gate structure, and partially overlaps the word line structure. The non-volatile memory further comprises a silicide layer 226, an interlayer dielectric layer 227, at least one metal bit line 229, and at least one contact plug 228. The silicide layer 226 is located on the surface of the drain region, the surface of the word line conductive layer 221b, and the surface of the erasing gate conductive layer 221a. The interlayer dielectric layer 227 is located on the substrate 201 and covers structures on the substrate 201. The metal bit line 229 is located on the interlayer dielectric layer; the contact plug 228 is located in the interlayer dielectric layer 227, a top end of the contact plug 228 is connected to the metal bit line 229, and a bottom end of the contact plug 228 is connected to the drain region. The substrate 201 is a P-type substrate, and correspondingly, the first conductive layer, the second conductive layer, the erasing gate conductive layer and the word line conductive layer are all N-type doped; or the substrate is an N-type pad, and correspondingly, the first conductive layer, the second conductive layer, the erasing gate conductive layer and the word line conductive layer are all P-type doped. The first gate dielectric layer 207 has a thickness ranging from 5 nm to 15 nm, the second gate dielectric layer 209 has a thickness ranging from 10 nm to 22 nm, the tunneling dielectric layer 218 has a thickness ranging from 8 nm to 15 nm, and the third gate dielectric layer 220 has a thickness ranging from 2 nm to 8 nm. Materials of the first conductive layer, the second conductive layer, the erasing gate conductive layer and the word line conductive layer may all comprise doped polysilicon.

The non-volatile memory according to the present invention can be read based on a suitable bias condition. Table 1 lists an example of read bias condition of a memory transistor.

TABLE 1

| Read bias condition | |
| --- | --- |
| Selected word line | 1.5-3.6 V |
| Selected control gate | 0-3.6 V |
| Selected bit line | 0.6-2 V |
| All others | 0 V |

Figure 41:
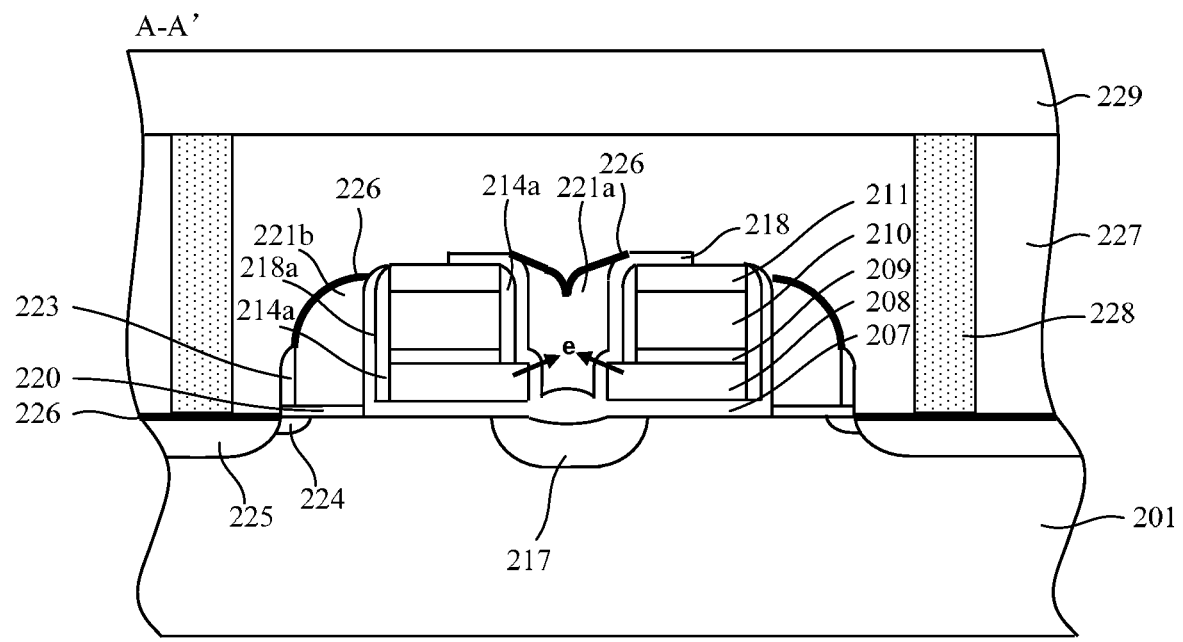
FIG. 41 and FIG. 42 are principle diagrams of an erase operation on a non-volatile memory according to the present invention.
Figure 42:
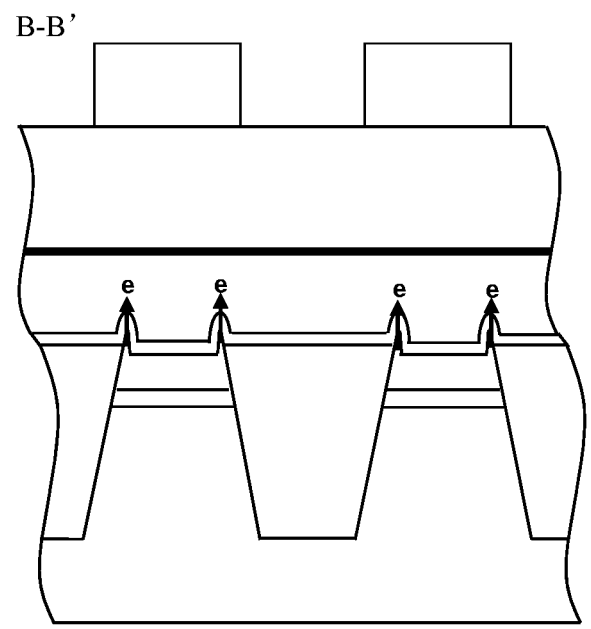

FIG. 41 and FIG. 42 are principle diagrams of an erase operation on a non-volatile memory according to the present invention. When the entire array is erased, injection of electrons from the floating gate to the erasing gate can be achieved in an FN tunneling manner due to the sharp portions of the erasing gate and the tip of the corner, thereby improving the erase efficiency. The erasing gate can be grouped into sectors or blocks, and in this case, the erase operation can be performed on the sectors or blocks. In FIG. 41 and FIG. 42, a path of electrons e is shown by the arrows. Table 2 lists an example of erase bias condition of the memory transistor.

TABLE 2

| Erase bias condition | |
| --- | --- |
| Selected erasing gate | 8-15 V |
| Selected control gate | (−8)-0 V |
| All others | 0 V |

Figure 43:
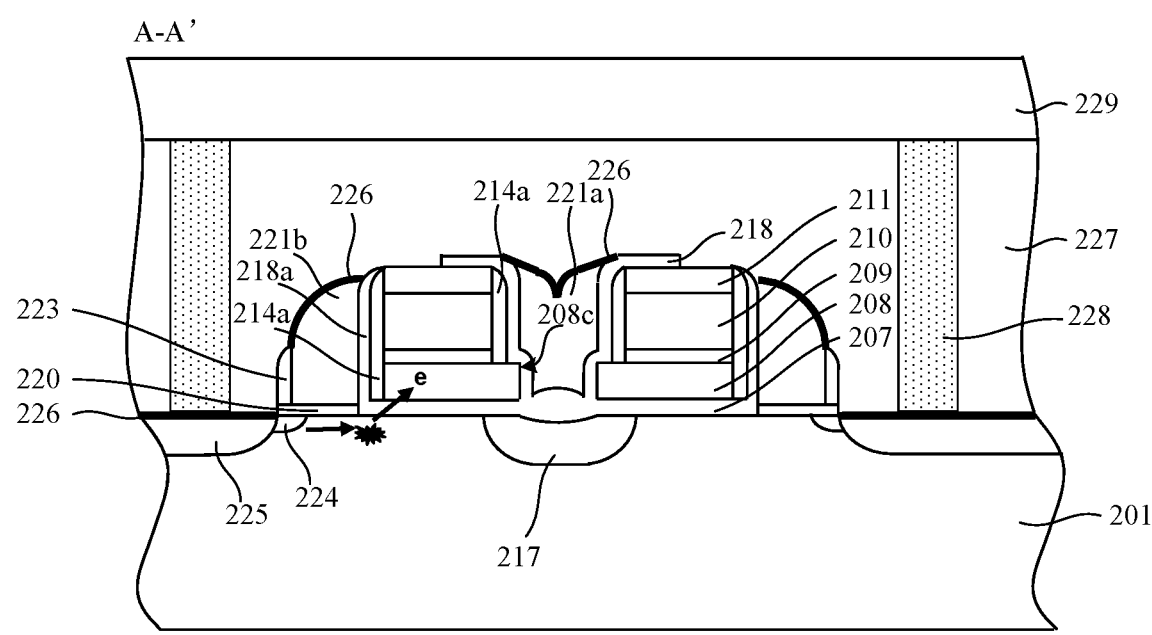
FIG. 43 is a principle diagram of a programming operation on a non-volatile memory according to the present invention.

FIG. 43 is a principle diagram of a programming operation on a non-volatile memory according to the present invention. During programming, a memory cell on the left is selected, and a memory cell on the right is not selected. During a programming operation, electrons (e) are injected from the drain region to the floating gate. In FIG. 43, a path of electrons e is shown by arrows. Table 3 lists an example of programming bias condition of the memory transistor.

TABLE 3

| Programming bias condition | |
| --- | --- |
| Selected word line | 0.8-2.0 V |
| Selected source line | 3.5-8 V |
| Selected control gate | 6-12 V |
| Selected bit line | 0-0.7 V |
| Unselected bit line | 1.2-3.6 V |
| Selected erasing gate | 0-5 V |
| All others | 0 V |

In conclusion, in the non-volatile memory according to the present invention, the floating gate structure has a first sharp portion and a second sharp portion, and the corner formed by a side surface of the floating gate structure and a part of a top surface of the floating gate structure is not covered by a control gate structure. The corner is connected between the first sharp portion and one end of the second sharp portion. A tunneling dielectric layer of the erasing gate structure covers the first sharp portion, the second sharp portion, and a tip part of the corner. During an erase operation, electrons are injected into the erasing gate structure from the first sharp portion, the second sharp portion and the tip of the corner of the floating gate structure in an FN tunneling manner, thereby effectively enhancing an FN tunneling effect between the floating gate and the erasing gate, and improving erase efficiency. The sharp portions of the floating gate as well as the corner not covered by the control gate structure helps increase the thickness of the tunneling dielectric layer between the erasing gate and the floating gate, thereby preventing current leakage and helping improve data retention. In the manufacturing method for a non-volatile memory according to the present invention, the floating gate structure having the first sharp portion and the second sharp portion is formed skillfully, and the process is simple and practical. Therefore, the present invention effectively overcomes various disadvantages in the prior art and hence has high industrial use value.

The foregoing embodiments are only to illustrate the principle and efficacy of the present invention exemplarily, and are not to limit the present invention. Any person skilled in the art can make modifications or variations on the foregoing embodiments without departing from the spirit and scope of the present invention. Accordingly, all equivalent modifications or variations completed by persons of ordinary skill in the art without departing from the spirit and technical thinking disclosed by the present invention should fall within the scope of claims of the present invention.

What is claimed is:

1. A manufacturing method for a non-volatile memory, comprising the following steps:
providing a substrate, and forming a sacrificial layer on the substrate;
forming at least one shallow trench isolation structure in the sacrificial layer and the substrate, wherein a lower portion of the shallow trench isolation structure defines a plurality of active regions in the substrate;
removing the sacrificial layer to obtain a plurality of grooves located on the substrate and defined by an upper portion of the shallow trench isolation structure;

forming a first gate dielectric layer and a first conductive layer in sequence from bottom to top in the grooves, and planarizing the first conductive layer until the first conductive layer is leveled with a top surface of the shallow trench isolation structure;

performing anisotropic etching to the first conductive layer to form a first sharp portion and a second sharp portion, wherein the first sharp portion and the second sharp portion are attached to two opposite sidewalls of the shallow trench isolation structure respectively;

removing a part of the shallow trench isolation structure so that tips of the first sharp portion and the second sharp portion are higher than the top surface of the shallow trench isolation structure;

forming at least one control gate structure on the first conductive layer, wherein the control gate structure comprises a second gate dielectric layer and a second conductive layer in sequence from bottom to top;

removing a part of the first conductive layer, wherein the remaining first conductive layer and the first gate dielectric layer under the remaining first conductive layer form a floating gate structure, the control gate structure covers a partial area of the floating gate structure, a corner formed by one side surface of the floating gate structure and a part of a top surface of the floating gate structure is not covered by the control gate structure, and the corner is connected between the first sharp portion and one end of the second sharp portion;

forming at least one erasing gate structure on the substrate, wherein the erasing gate structure is located on a side, which is provided with the corner, of the floating gate structure and comprises a tunneling dielectric layer and an erasing gate conductive layer in sequence from bottom to top, the tunneling dielectric layer covering the first sharp portion, the second sharp portion and a tip part of the corner; and forming at least one word line structure on the substrate, wherein the word line structure is located on a side, which is away from the corner, of the floating gate structure and comprises a third gate dielectric layer and a word line conductive layer in sequence from bottom to top;

wherein removal of a part of the first conductive layer to form the floating gate structure comprises the following steps:

forming a patterned photoresist layer to cover the first conductive layer above a source region;

removing a part of the first conductive layer which is not covered by the patterned photoresist layer and the control gate structure;

removing the patterned photoresist layer;

forming at least one first sidewall structure on each side of the first conductive layer, each side of the control gate structure, and each side of the protection dielectric layer;

forming at least one second sidewall structure on an external side of the first sidewall structure, and removing a part of the first gate dielectric layer which is not covered by the first conductive layer, the first sidewall structure and the second sidewall structure;

removing a part of the first conductive layer which is not covered by the control gate structure, the first sidewall structure and the second sidewall structure;

injecting ions to the source region; and removing at least a part of the second sidewall structure to expose the tip of the corner, the tip of the first sharp portion, and the tip of the second sharp portion, and removing a part of the first gate dielectric layer which is not covered by the first conductive layer.

2. The manufacturing method for a non-volatile memory according to claim 1, wherein the sacrificial layer at least comprises a pad oxide layer and a nitride layer located on the pad oxide layer.

3. The manufacturing method for a non-volatile memory according to claim 1, wherein forming the control gate structure comprises the following steps:

forming the second gate dielectric layer, the second conductive layer and a protection dielectric layer in sequence from bottom to top;

forming a patterned photoresist layer on the protection dielectric layer to define a control gate region; and performing anisotropic etching downward by using the patterned photoresist layer as a mask, until the first conductive layer is exposed, thereby obtaining the control gate structure.

4. The manufacturing method for a non-volatile memory according to claim 1, wherein forming the erasing gate structure and the word line structure comprises the following steps:

depositing the tunneling dielectric layer, wherein the tunneling dielectric layer covers the surface of the substrate and structures on the substrate;

removing a part of the tunneling dielectric layer, and reserving a part of the tunneling dielectric layer which is located above the source region;

forming a third gate dielectric layer on the surface of the substrate;

forming a third conductive layer on the surfaces of the third gate dielectric layer and the tunneling dielectric layer; and removing a part of the third conductive layer, reserving a part of the third conductive layer which is located above the source region as an erasing gate conductive layer, and reserving a part of the third conductive layer which is located on a side of the floating gate structure away from the corner as a word line conductive layer.

5. The manufacturing method for a non-volatile memory according to claim 4, wherein a part of the tunneling dielectric layer is further reserved as a third sidewall structure, the third sidewall structure and the erasing gate structure are located on the two opposite sides of the floating gate structure, and the third sidewall structure covers an external side surface of the first sidewall structure.

6. The manufacturing method for a non-volatile memory according to claim 4, further comprising a step of forming at least one fourth sidewall structure on a side of the word line conductive layer which is away from the floating gate structure.

7. The manufacturing method for a non-volatile memory according to claim 1, further comprising the following steps:

forming at least one drain region in the substrate, wherein the drain region is located on a side of the word line structure which is away from the floating gate structure, and partially overlaps the word line structure;

forming a silicide layer on the surface of the drain region, the surface of the word line conductive layer, and the surface of the erasing gate conductive layer;

forming an interlayer dielectric layer on the substrate to cover structures on the substrate;

forming at least one metal bit line on the interlayer dielectric layer; and forming at least one contact plug in the interlayer dielectric layer, wherein a top end of the contact plug is connected to the metal bit line, and a bottom end of the contact plug is connected to the drain region.

* * * * *